United States Patent [19]

Yamashita et al.

[11] Patent Number: 4,981,549
[45] Date of Patent: Jan. 1, 1991

[54] METHOD AND APPARATUS FOR GROWING SILICON CRYSTALS

[75] Inventors: Ichiro Yamashita; Koutaro Shimizu, both of Omiya; Yoshiaki Banba, Urawa; Yasushi Shimanuki, Hasuda; Akira Higuchi, Omiya; Hisashi Furuya, Itami, all of Japan

[73] Assignees: Mitsubishi Kinzoku Kabushiki Kaisha; Japan Silicon Co., Ltd., both of Tokyo, Japan

[21] Appl. No.: 313,799

[22] Filed: Feb. 22, 1989

[30] Foreign Application Priority Data

Feb. 23, 1988 [JP] Japan .................................. 63-40485
Jun. 13, 1988 [JP] Japan ................................ 63-145260
Oct. 5, 1988 [JP] Japan ................................ 63-251151
Oct. 5, 1988 [JP] Japan ................................ 63-251152
Oct. 5, 1988 [JP] Japan ................................ 63-251153
Oct. 5, 1988 [JP] Japan ................................ 63-251154

[51] Int. Cl.$^5$ ...................... C30B 15/14; C30B 29/06; C30B 33/00; C30B 35/00
[52] U.S. Cl. .............................. 156/620.4; 156/617.1; 156/DIG. 73; 156/DIG. 64; 422/249; 148/DIG. 3; 148/DIG. 71
[58] Field of Search ................. 156/603, 617.1, 618.1, 156/620.2, 620.4, DIG. 64, DIG. 73; 437/12, 13; 422/249; 148/DIG. 3, DIG. 71

[56] References Cited

U.S. PATENT DOCUMENTS 4,661,166 4/1987 Hirao ..................................... 437/12

OTHER PUBLICATIONS

Japanese Patent Application JA0163190, Jul. 86.

Primary Examiner—Gary P. Straub
Attorney, Agent, or Firm—Scully, Scott, Murphy & Presser

[57] ABSTRACT

A silicon single-crystal growing method is disclosed which immerses a seed crystal in a silicon melt and pulls the seed crystal from the melt to thereby grow a silicon single-crystal, and in which the dwelling time of the silicon single-crystal, which is being pulled in a temperature range of between 1,050° to 850° C., is set to be no longer than 140 min. The apparatus suitable for practicing the above method has a crucible, a pulling mechanism, and a temperature control shell. The temperature control shell is located above the crucible for cooling said silicon single-crystal at a cooling rate such that the dwelling time of said silicon single-crystal, which is being pulled in a temperature range of between 1,050° to 850° C., is not longer than 140 min.

1 Claim, 12 Drawing Sheets

FIG. 16
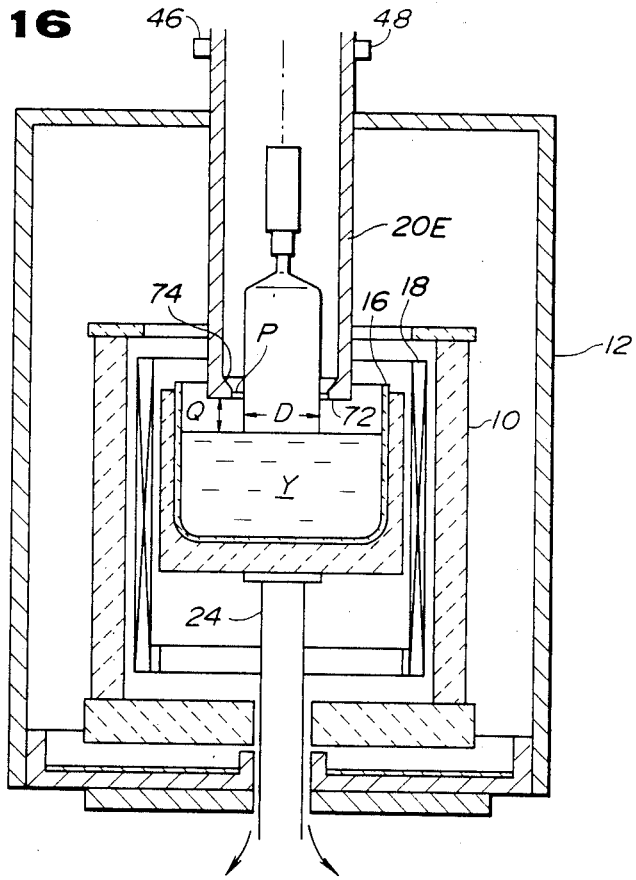
FIG. 17    FIG. 18
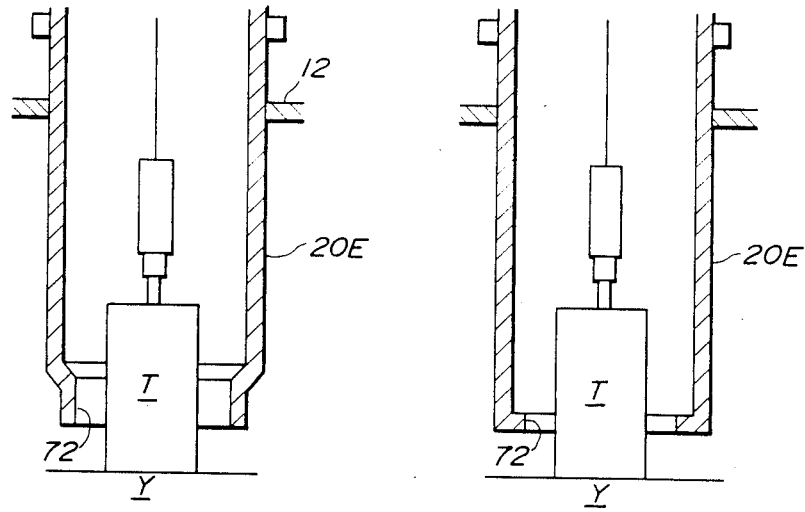

METHOD AND APPARATUS FOR GROWING SILICON CRYSTALS

BACKGROUND OF THE INVENTION

1. Field of the Invention

The present invention pertains to methods and apparatuses for growing single-crystals of silicon by the Czochralski technique, and in particular, to improvements to effectively prevent oxidation induced stacking fault (OSF) formation.

2. Prior Art

High temperature heat treatments in the semiconductor device process sometimes generate OSF in CZ (Czochralski) silicon wafers. OSF in the electronically active layer near the surface could induce device failures by causing current leakage and result in a shortened lifetime of carrier.

The supersaturated oxygen in the single-crystals has hitherto been considered to be responsible for OSF formation. More specifically, when CZ single-crystals are subjected to high temperature heat treatments, oxygen atoms produce miniscule $SiO_2$ precipitates. As the oxygen precipitate enlarges, it produces interstitial silicon which has been supposed to induce a secondary defect such as OSF.

The inventors have previously proposed a method of growing silicon single-crystals which can prevent the formation of the oxygen precipitates, as disclosed in Japanese Patent Application A-Publication No. 61-201692. The method comprises the steps of providing a temperature control device at a prescribed range of the silicon single-crystal during pulling, and holding the entire single-crystal at a temperature range of between 1,100° and 900° C. for a period of at least three hours, and its object has been to prevent the formation of oxygen precipitates, thereby reducing OSF formation during high temperature heat treatments in the semiconductor device process.

However, after a further investigation, the inventors have found that the above-mentioned method definitely prevents the formation of the oxygen precipitates, but causes an increase in the OSF densities after high temperature treatments.

SUMMARY OF THE INVENTION

It is therefore an object of the present invention to provide an improved method for growing silicon crystals which can positively reduce OSF formation in the silicon crystals.

Another object of the invention is to provide an apparatus suitably employed for practicing the above method.

According to the first aspect of the invention, there is provided an improved method of growing silicon single-crystals which comprises the steps of immersing a seed crystal in a silicon melt and pulling the seed crystal from the melt to thereby grow a silicon single-crystal, the improvement comprising setting a dwelling time of the silicon single-crystal which is being pulled in a temperature range of between 1,050° to 850° C. for no longer than 140 min.

According to the second aspect of the invention, there is provided an apparatus for growing silicon single-crystals, comprising (a) a crucible for holding a silicon melt; (b) pulling means for pulling a seed crystal immersed in the silicon melt; and (c) temperature control means located above the crucible for cooling the silicon single-crystal at a cooling rate such that a dwelling time of the silicon single-crystal which is being pulled, in a temperature range of between 1,050° to 850° C., is no longer than 140 min.

BRIEF DESCRIPTION OF THE DRAWINGS

FIGS. 16 to 19 are cross-sectional views of modifications of the embodiment of FIG. 15, respectively;

DESCRIPTION OF THE PREFERRED EMBODIMENTS OF THE INVENTION

Figure 1:
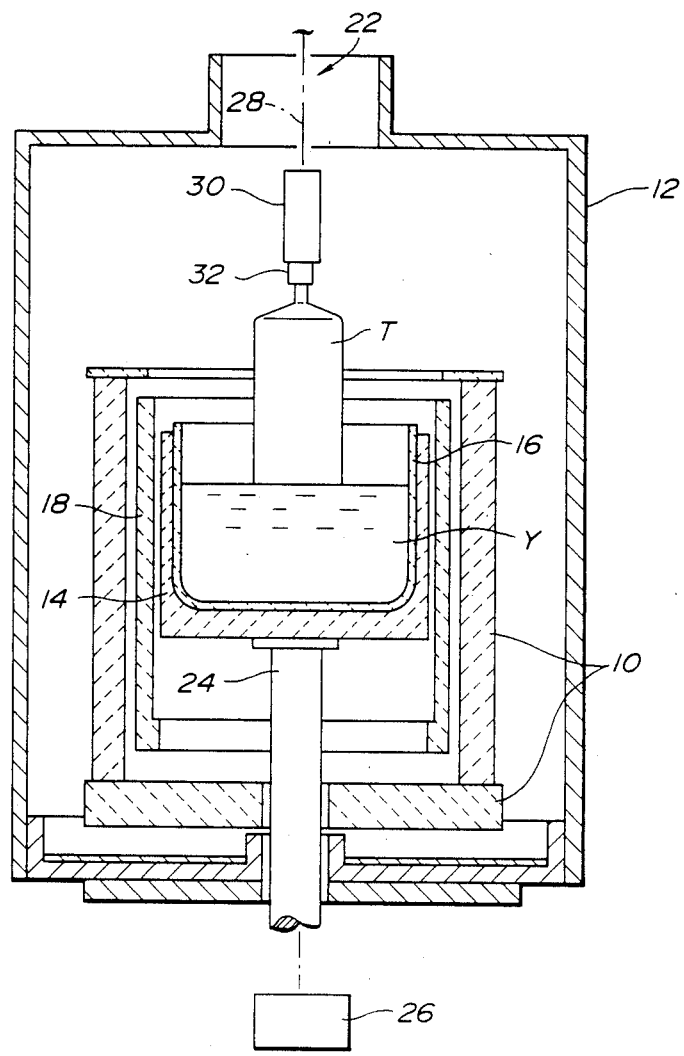
FIG. 1 is a cross-sectional view of a crystal growing apparatus employed for experiments.

In the course of the investigation, the inventors have analyzed the effects of the thermal history on the OSF formation by using a crystal growing apparatus as shown in FIG. 1. The crystal growing apparatus comprises a heat reserving shell 10 housed in a furnace 12, a graphite susceptor 14 or a support bowl housed in the heat reserving shell 10, a quartz crucible 16 housed in the susceptor 14, a resistance heater 18 disposed within the shell 10 so as to surround the susceptor 14, and a crystal pulling mechanism 22. The susceptor 14 is mounted on a shaft 24 drivingly connected to a main drive mechanism 26 which permits the vertical movement and axial rotation of the shaft 24 during operation. The crystal pulling mechanism 22 comprises a pulling wire or rod 28, a chuck 30 secured thereto for retaining a seed crystal 32 and a drive mechanism (not shown) for pulling and rotating the wire 28.

Figure 2:
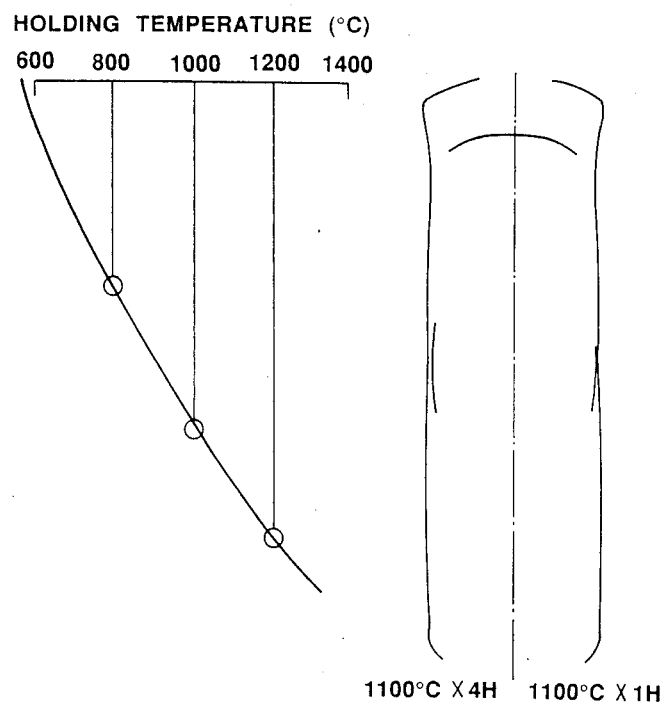
FIG. 2 is a diagrammatical representation showing the effect of in-situ annealing in the apparatus of FIG. 1 on OSF formation.

Crystal halting experiments were first performed by using the above apparatus. Crystals were subjected to excessive in-situ annealing in the above apparatus by halting the pulling for two hours just before bottom end-cone formation. In the case of a p<100> CZ crystal, 5" in diameter, for example, pulling was halted for two hours when the length of the crystal was 425 mm. Consequently, the crystal was subjected to in-situ annealing at temperatures which depended on the distance from the melt surface during the halt (FIG. 2). Oxygen and carbon concentrations were $1.0 \times 10^{18}$ and less than $1.0 \times 10^{16} cm^{-3}$, respectively. The conversion coefficients used in determining these concentrations were $3.0 \times 10^{17}$ and $1.1 \times 10^{17} cm^{-3}$, respectively. From this crystal, specimens were cut as slabs and some specimens were annealed at 1,100° C. for one hour, and other specimens for four hours, in wet oxygen. Preferential etch was used to reveal OSF. As shown in FIG. 2, OSFs were formed in the periphery of the crystal part which was annealed at 900° to 1,000° C. in the apparatus during the halt of pulling.

Figure 3:
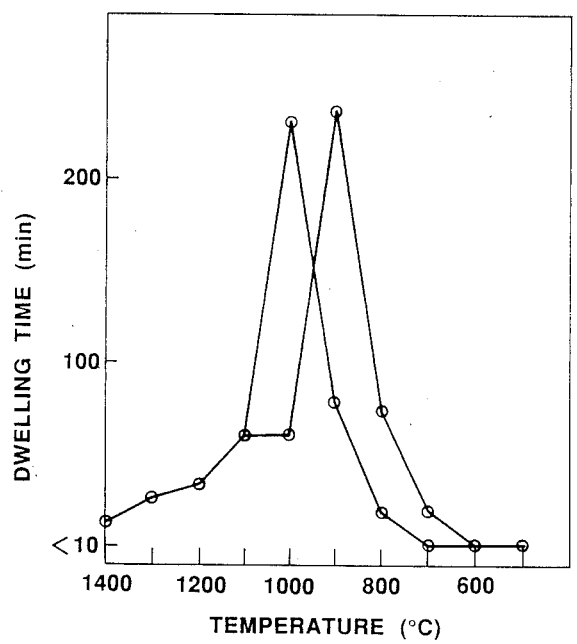
FIG. 3 is a graph showing the thermal history of a crystal subjected to a halting of pulling.

In FIG. 3, thermal histories of the top end and of the bottom end of this part are plotted. Dwelling time in this figure means the time for cooling through ±50° C. of each temperature indicated on the abscissa. It is clear that the part in which OSFs were formed was subjected to a remarkably long dwelling in the 900° to 1,000° C. range.

From results of halting experiments on four crystals, it was concluded that the thermal conditions on crystals in the 850° to 1,050° C. range enhances OSF formation.

To confirm the role of thermal history in OSF formation, the effect of cooling rate of crystals was examined. A p<100> CZ crystal, 6" in diameter and 575 mm in length, was grown as a reference crystal. After bottom end-cone formation, the pulling of the crystal continued at the same rate as that during crystal growth so that the crystal cooled down slowly. To make a crystal which was rapidly cooled, a crystal similar to the reference crystal was detached during crystal pulling at 420 mm in length and pulled up to the top of the apparatus immediately. Oxygen and carbon concentrations in these crystals were similar with those noted above. Specimens cut from these crystals were annealed by the following conditions: holding at 750° C. for 10 min, ramping up at 2° C./min to 1,100° C., and finally holding at 1,100° C. for 1 hour in wet oxygen. Specimens were etched off by 100 μm and preferentially etched to reveal OSF.

Figure 4:
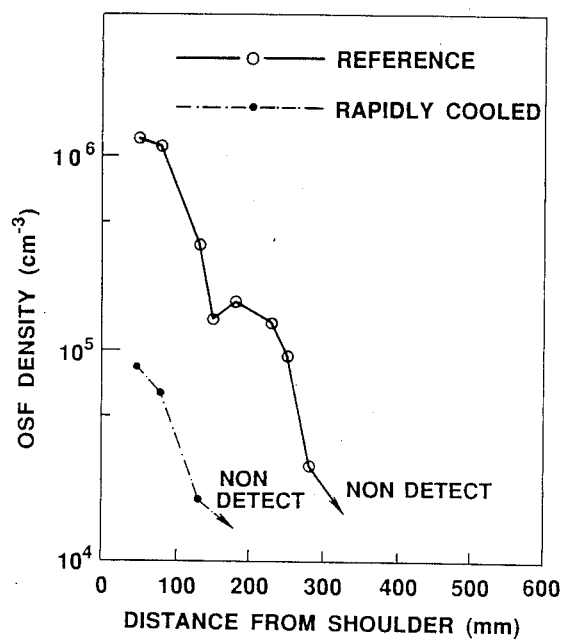
FIG. 4 is a graph showing OSF densities of crystals in a crystal detaching experiment.
Figure 5:
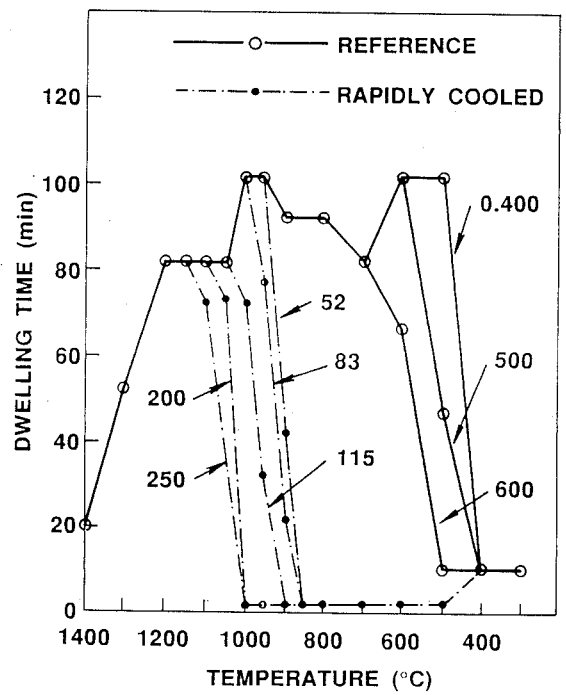
FIG. 5 is a graph showing thermal histories of crystals in the crystal detaching experiment.

In the rapidly cooled crystal, OSF density was reduced by one order of magnitude compared with that in the reference crystal (FIG. 4). Thermal histories of the two crystals are plotted in FIG. 5. The former crystal was rapidly cooled down from the 850° to 1,100° C. range.

Thus, it can be seen from the above experiments that long dwelling time in the 850° to 1,050° C. range enhances OSF formation. The crystal growing method in accordance with the present invention is developed according to this knowledge, and is characterized by setting the dwelling time of the silicon single-crystal in the 850° to 1,050° C. range for no longer than 140 min. More specifically, the crucible 16 is first filled with a charge of silicon material, and then the air of the furnace 12 is replaced by argon gas, which is blown into the furnace 12 through an opening of its upper wall.

Thereafter, the silicon material is melted completely by the heater 18, and the growing of a single-crystal T is commenced in a usual manner. Namely, while rotating the crucible 16 at a prescribed rate, the seed crystal 32 is lowered and placed in contact with the surface of a melt Y until the crystal commences to form about the seed 32, at which time the seed crystal 32 is pulled at a prescribed rate while being rotated. As a single-crystal T is grown and pulled, it is cooled at a prescribed cooling rate. In the method of the present invention, the cooling rate and other conditions are adjusted so that the dwelling time of the silicon single-crystal in the 850° to 1,050° C. range is not longer than 140 min. With this method, OSF formation during high temperature treatments can be surely prevented.

If the dwelling time of the crystal in the 850° to 1,050° C. range exceeds 140 min, densities of OSF formed during high temperature treatments increase to an unacceptable level. Furthermore, when the temperature range differs from the above range, OSF formation cannot be prevented even if the dwelling time is adjusted so as not to be longer than 140 min.

A modification of the above method further comprises the step of adjusting the dwelling time of the single-crystal in the 600° to 800° C. range so as to be at least two hours. When wafers cut from the single-crystal produced according to the above method are subjected to various heat treatments, oxygen precipitates may not be sufficiently produced in some cases. The inventors have found that if the oxygen precipitates are insufficient, contaminants adhering to the surface of the wafer induce device failures by current leakage and result in reduced lifetime, and that if the single-crystal is heated in the above-mentioned way, the formation of the oxygen precipitates is sufficient.

Next, the crystal growing apparatus employed to practice the above method will be described.

Figure 6:
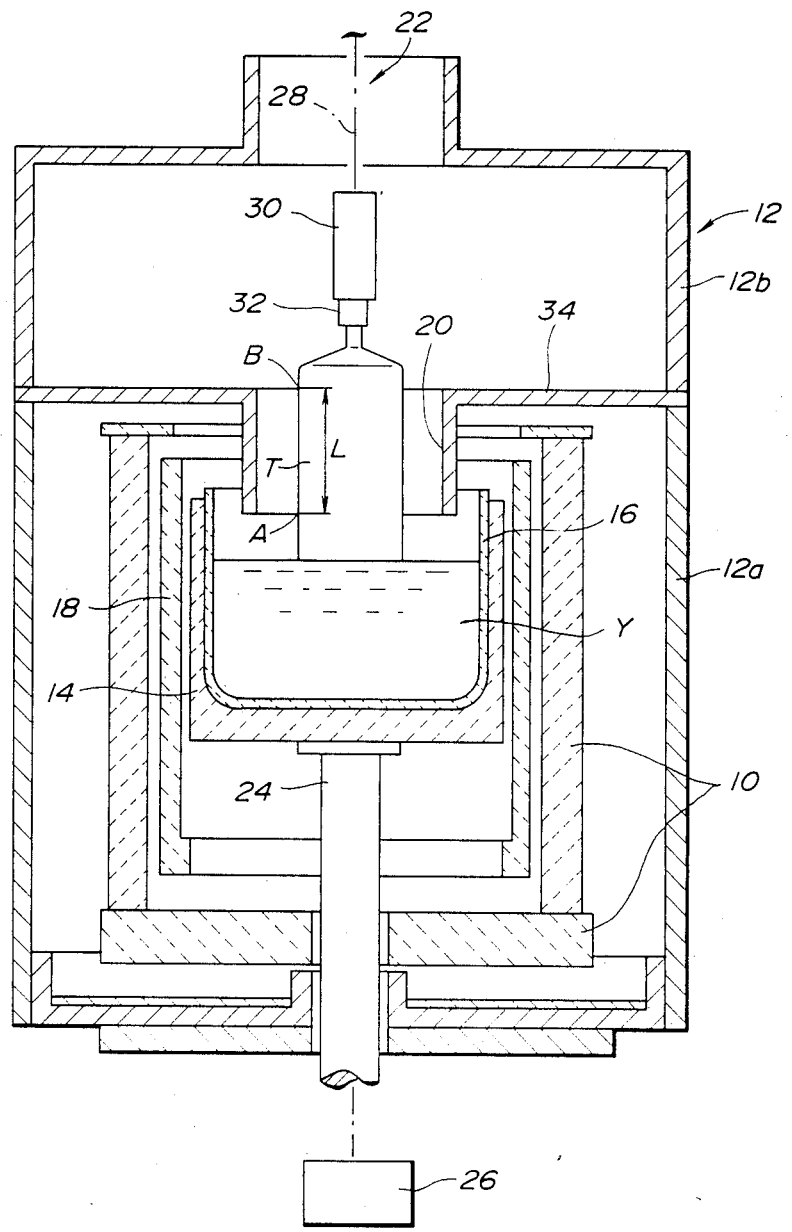
FIG. 6 is a cross-sectional view of a crystal growing apparatus in accordance with the present invention.

FIG. 6 illustrates an arrangement of the apparatus in accordance with the present invention. The apparatus is basically similar to that shown in FIG. 1, but includes a temperature control shell 20 of a cylindrical shape disposed above the crucible 16 so as to surround a prescribed portion of a silicon single-crystal rod T which is being pulled from a melt Y. The temperature control shell 20 is specially designed to cool the single-crystal T so that the dwelling time of the silicon single-crystal T in the 850° to 1,050° C. range is not longer than 140 min. Such a temperature control shell may be replaced by temperature control means of any form, but the shell is the most preferable. The shell may be a reflecting shell formed of an annular reflecting metal plate for preventing the radiating of heat to the single-crystal, or may be a cooling shell in the form of an annular water jacket which actively cools the crystal. In the case of the cooling shell, any coolant other than water could as well be used. Furthermore, as shown in FIG. 6, the shell is provided with arms 34, and is replaceably supported on the furnace 12 by inserting the arms 34 between lower part 12a and upper part 12b of the furnace 12. The arms 34 may be replaced by an annular plate mounted on an outer periphery of the cooling shell at its upper end.

Figure 7:
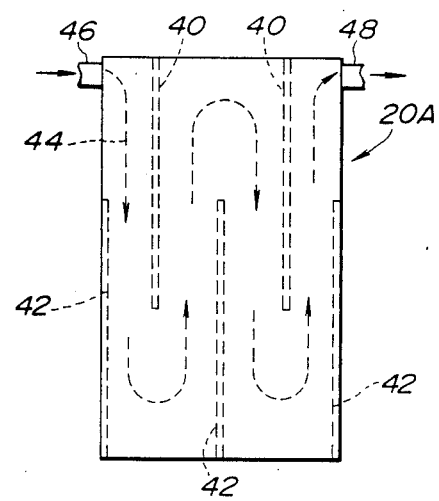
FIG. 7 is a side elevation of a cooling shell employed in the apparatus of FIG. 6.

In the preferred embodiment, a cooling water shell 20A is employed as shown in FIG. 7. The cooling shell 20A comprises outer and inner cylindrical shells of stainless steel or molybdenum (Mo) connected together at upper and lower ends thereof to define a closed space therebetween, and upper and lower partition walls 40 and 42 mounted within the space to define a coolant passageway 44. The cooling shell 20A is provided with an inlet 46 and an outlet 48 at the upper end, and is disposed around that portion of the silicon single-crystal T which has a temperature of between 850° and 1,050° C. More specifically, as shown in FIG. 6, if the points of the single-crystal where the temperatures 1,050° C. and 850° C. are designated by A and B, respectively, the cooling shell 20A is disposed so as to surround the portion of the single-crystal between the two points A and B which has the length L.

Figure 8:
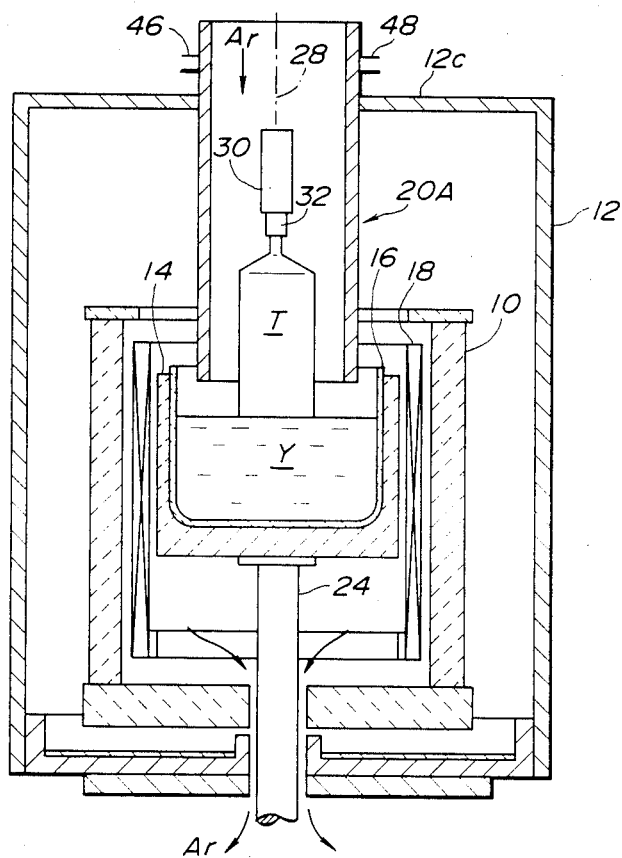
FIG. 8 is a cross-sectional view of a modified crystal growing apparatus in accordance with the invention.

In the foregoing, the cooling shell 20A may be disposed around the crystal in such a manner that a lower end of the shell 20A is located below that point, as at A, of the single-crystal T where the temperature is about 1,050° C. Furthermore, as shown in FIG. 8, the upper end of the cooling shell 20A may be connected to an upper wall portion 12c of the furnace 12. In such a case, argon gas is blown into the furnace through the cooling shell 20A. Moreover, the the cooling shell 20A may be formed so that it has a spiral coolant passage extending axially spirally thereof.

Figure 9:
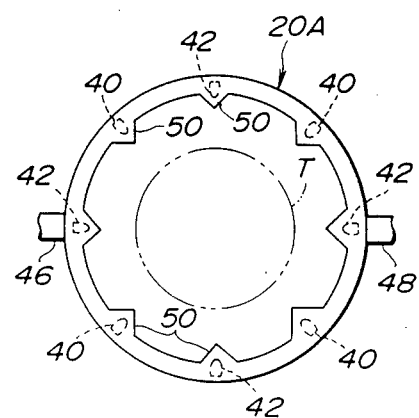
FIG. 9 is a plan view of a modified cooling shell.

FIG. 9 depicts a modification of the cooling shell 20A which has a plurality of projections 50 formed in an inner peripheral surface thereof in circumferentially equally spaced relation to one another and extending from the upper end to the lower end. Each projection 50 has a cross-section of an obtuse triangular shape. With this construction, the surface area of the inner peripheral surface of the cooling shell 20A is increased substantially. As a result, heat rays emitted from the single-crystal can be absorbed by the shell 20A more readily. In addition, the heat exchange efficiency between the cooling shell 20A and the ambient gas, as well as the heat exchange efficiency between the ambient gas and the single-crystal, is enhanced, so that the cooling effect of the single-crystal is substantially improved. In order to adjust the dwelling time of the single-crystal in the temperature range of between 850° and 1,050° C. so as not to be longer than 140 min, the cooling efficiency of the cooling shell should preferably be increased. The above construction of the cooling shell enhances the cooling efficiency, so that the adjustment of the dwelling time can be easily carried out. Furthermore, inasmuch as the projections 50 are formed to extend axially of the cooling shell 20A, the argon gas passing through the cooling shell 20A flows laminarly and is not chaotic, and thereby impurities are prevented from adhering to the cooling shell.

In the foregoing, it is preferable that the protruding length of each projection 50 is set to 5 to 80% of the distance between the inner peripheral surface of the cooling shell 20A and the single-crystal T. If the length is less than the above range, the surface area of the inner periphery of the cooling shell cannot be sufficiently increased. On the other hand, if the distance exceeds the above range, the projections 50 adversely affect the single-crystal by causing an unevenness in cooling. Furthermore, instead of the projections, the cooling shell may be provided with a plurality of grooves formed in an inner peripheral surface thereof. The projections or grooves may be formed to extend in a horizontal direction or to extend spirally. Isolated recesses or protrusions may be provided, and small fins for use as heat exchangers may be employed. Furthermore, in order to facilitate the absorption of the heat rays, the inner peripheral surface of the cooling shell 20A may be painted black, or the inner plate of the cooling shell may be formed of a black material.

Figure 10:
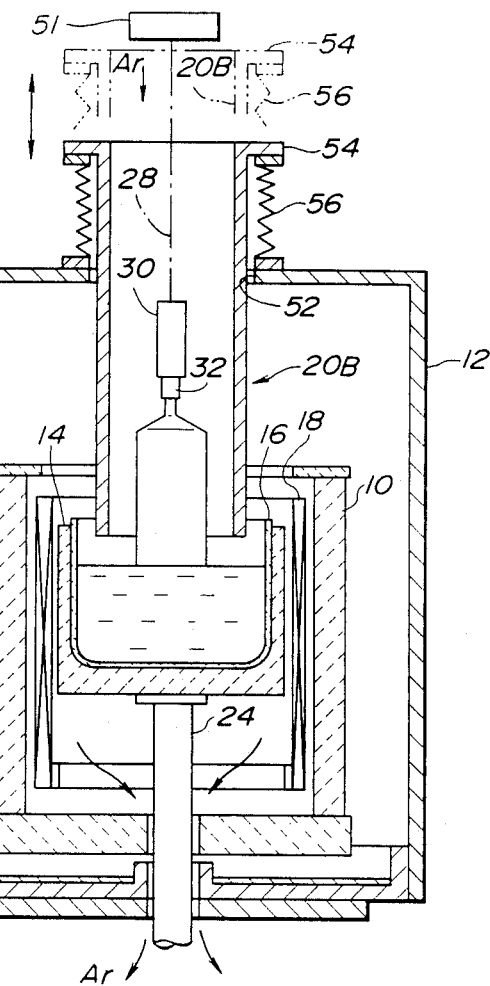
FIG. 10 is a cross-sectional view of another modified crystal growing apparatus in accordance with the invention.

FIG. 10 illustrates a further modification of the crystal growing apparatus in accordance with the present invention which differs from the apparatus shown in FIG. 8 in that a cooling shell 20B, movable in a vertical direction, is provided, and a lifting mechanism 51 for moving the cooling shell vertically is attached to the upper end of the cooling shell 20B. More specifically, a circular opening 52 larger in diameter than the cooling shell 20B is formed in the upper wall portion of the furnace 12, and the cooling shell 20B is inserted therethrough for sliding movement. The cooling shell 20B is provided with a flange portion 54 at its upper end, and a cylindrical bellows 56 of stainless steel is interposed between the flange portion 54 and the outer periphery of the opening 52 of the upper portion of the furnace 12 so as to form a seal around the outer periphery of the cooling shell 20B. The bellows 56 has a sufficient heat-resistance, and can follow the sliding movement of the cooling shell 20B. The bellows 56 is also resistant to the pressure difference between the pressure outside the furnace 12 and that within the furnace 12.

With the above construction, the cooling shell 20B can be moved vertically by actuating the lifting mechanism 51. Accordingly, the vertical position of the cooling shell 20B can be easily adjusted so that the cooling rate of that portion of the single-crystal in the 850° to 1,050° C. range is made optimal and the dwelling time for that portion is not longer than 140 min. In addition, if the cooling shell 20B is moved to a higher position when melting the silicon material, heat loss caused by the cooling shell 20B can be avoided, so that the silicon material can be melted very efficiently. After the material is melted completely, the cooling shell 20B is moved to its lower position, and the crystal pulling operation is commenced.

Figure 11:
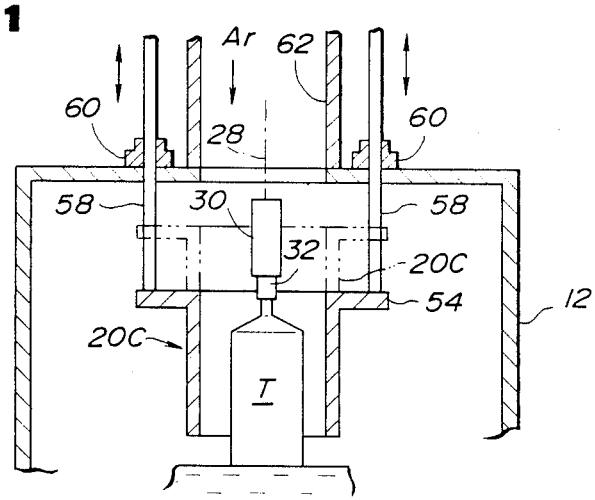
FIG. 11 is a cross-sectional view of a modified arrangement of the embodiment of FIG. 10.
Figure 12:
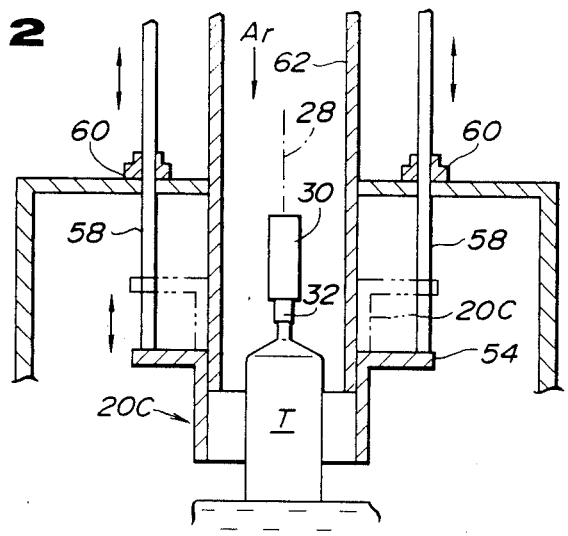
FIG. 12 is a cross-sectional view of another modified arrangement of the embodiment of FIG. 10.

FIG. 11 depicts a modified arrangement of the apparatus of FIG. 10. In this arrangement, a shorter cooling shell 20C is employed. A pair of lifting rods 58, which are securely fixed at their lower ends to the flange portions 54 of the cooling shell 20C, are slidably inserted through the upper wall portion of the furnace, and a pair of seals 60 are mounted on the upper wall to maintain the sealing relation between a respective rod and the furnace 12. Although not illustrated, a lifting mechanism is attached to the lifting rods 58, so that the rods 58 can be moved up and down. The lifting rods 58 also have coolant passages therein, and serve as the inlet and outlet for the coolant. In the foregoing, a cylindrical shell 62 for introducing argon gas is mounted on the upper wall portion of the furnace 12 so as to extend upward, but it may also be elongated downward as shown in FIG. 12 so that the cooling shell 20C is generally sealingly fitted on its lower end portion for sliding movement. With this arrangement, the argon gas flowing into the furnace is efficiently directed toward the single-crystal T. Furthermore, the lifting rods may be disposed to extend downward, and the lifting mechanism may be located under the furnace.

Figure 13:
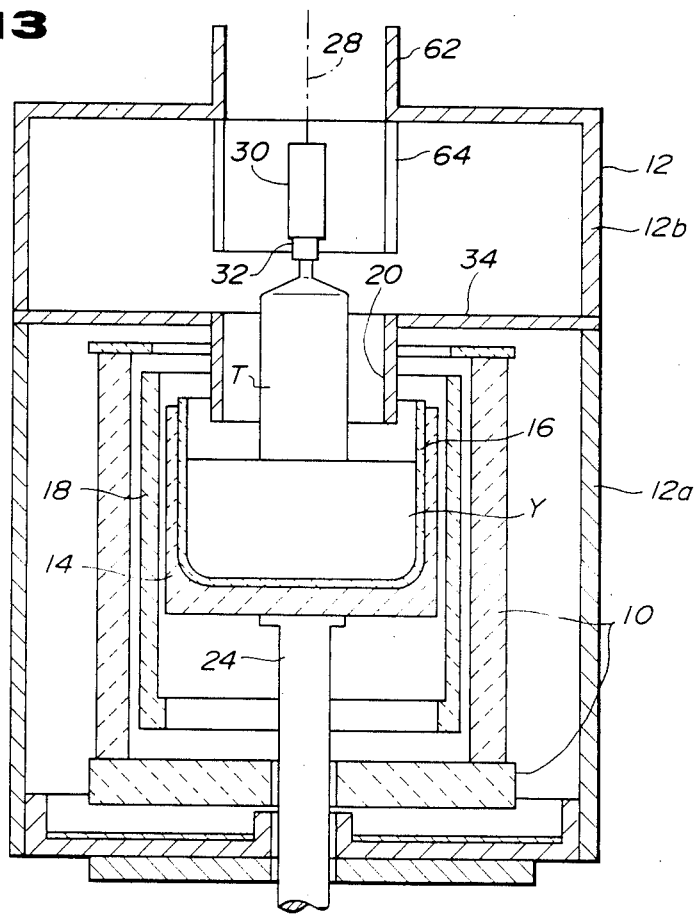
FIG. 13 is a cross-sectional view of a further modified crystal growing apparatus in accordance with the invention.

FIG. 13 depicts a further modification of the crystal growing apparatus which differs from the first embodiment shown in FIG. 6 only in that a secondary heater 64 is securely fixed to the inner face of the upper wall of the furnace 12 so as to be coaxial with the cylindrical shell 62 for introducing argon gas. This secondary heater 64 is designed and positioned to heat the single-crystal T at a rate such that the dwelling time of the single-crystal in the 600° to 800° C. range is not shorter than two hours. With this construction, the single-crystal T, cooled by the cooling shell 20, is heated by the secondary heater 64 such that the dwelling time of the single-crystal in the 600° to 800° C. range is at least two hours. Accordingly, the formation of oxygen precipitates during high temperature treatments can be ensured.

Figure 14:
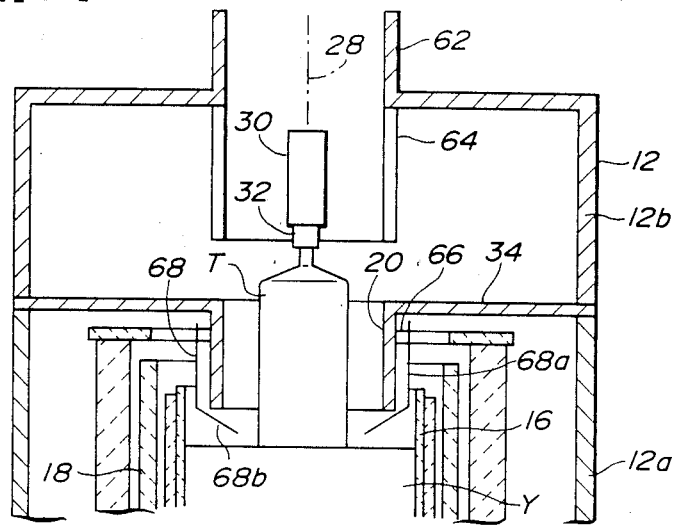
FIG. 14 is a cross-sectional view of a modification of the embodiment of FIG. 13.

FIG. 14 shows a further modification of the apparatus shown in FIG. 13. In this arrangement, the cooling shell 20 has an externally threaded outer peripheral surface, and an internally threaded annular ring 66, made of a heat insulating material such as quartz, is screwed on the cooling shell 20. An annular shield member 68 for shielding the cooling shell 20 from the crucible 16 and from the melt Y in the crucible 16 is securely fixed to the outer periphery of the annular ring 66, and can be moved up and down along the cooling shell 20 by changing the position of the annular ring 66 relative to the cooling shell 20. The shield member 68 is made of molybdenum and is comprised of a cylindrical portion 68a of a diameter smaller than that of the crucible 16, and a downwardly tapered portion 68b formed at the lower end of the cylindrical portion 68a and extending radially inwardly and downwardly from the lower end of the cooling shell 20. In the case where the lower end of the cooling shell 20 is close to the crucible 16 or the melt Y in the crucible 16, the crucible 16 or the melt Y is cooled by the cooling shell 20, so that the silicon melt would be subjected to recrystallization from the part adjacent to the inner peripheral surface of the crucible 16. In the illustrated embodiment, however, the shield member 68 shields the crucible 16 and the melt Y therein from the cooling shell, so that the recrystallization of the melt can be effectively prevented.

Figure 15:
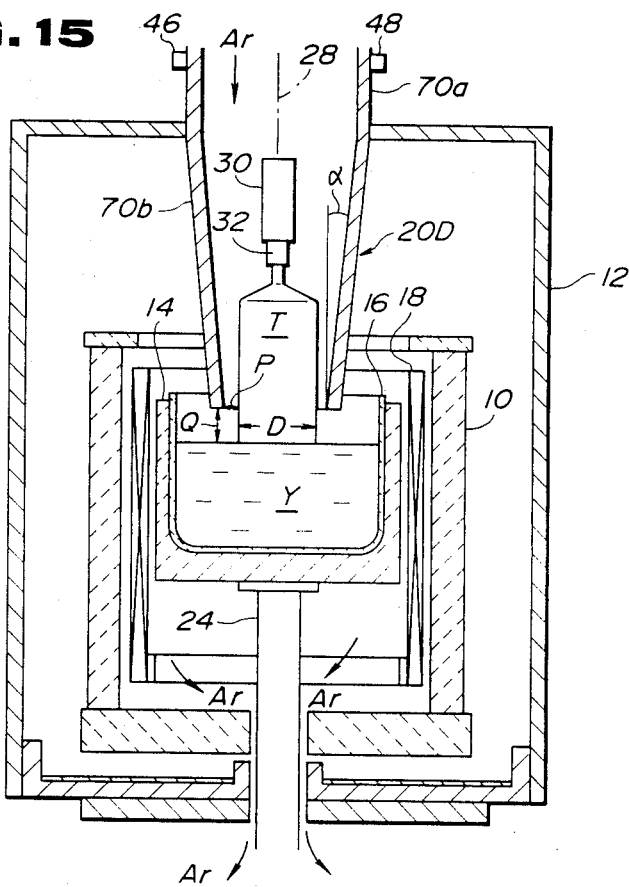
FIG. 15 is a cross-sectional view of a further modified crystal growing apparatus in accordance with the invention.

FIG. 15 illustrates a further modified crystal growing apparatus of the invention which includes a cooling shell 20D comprised of a cylindrical upper portion 70a and a tapered portion 70b tapering downwardly from the upper portion 70a. The cooling shell 20D is inserted through and securely fixed to the upper wall portion of the furnace 12 with its upper portion 70a disposed outside the furnace 12 and with its tapered portion 70a inside the furnace 12. The diameter of the lower end of the cooling shell 20D is selected so that the distance P between the outer peripheral surface of the single-crystal to be pulled and the cooling shell 20D is 10 to 70% of the diameter D of the single-crystal T. If the diameter is less than the above range, the cooling efficiency of the single-crystal T varies greatly when the distance P between the single-crystal T and the cooling shell 20D fluctuates, thereby adversely affecting the quality of the single-crystals. On the other hand, if the diameter exceeds the above range, SiO vapor produced by the reaction of the silicon melt Y with quartz of the crucible 16 enters the cooling shell 20D to be deposited on the inner peripheral surface of the lower end of the cooling shell 20D. Shortly after formation, the deposit falls into the melt Y and induces the dislocation in the single-crystals. The above range, however, should be used only in the case where the flow rate of argon gas is the same as that in the prior art apparatus, i.e., about 10 to 200 l/min at 10 Torr. If the flow rate changes, the velocity of gas flowing out from the lower end of the cooling shell 20D should be adjusted to 5 to 70 cm/sec. In this range, the SiO vapor can be successfully prevented from entering the cooling shell 20D.

Furthermore, the distance Q between the lower end of the cooling shell 20D and the surface of the melt Y in the crucible 16 should be preferably maintained at 5 to 80% of the diameter D of the single-crystal T by adjusting the vertical position of the shaft 24. If the distance is less than the above range, the argon gas supplied through the cooling shell 20D is caused to blow against a portion of the melt Y adjacent to the crystallization front of the single-crystal T, so that the portion is excessively cooled. Therefore, the single-crystal may be subjected to crystal dislocation due to thermal strain at the crystallization front. On the other hand, if the distance Q exceeds the above range, a sufficient cooling effect of the cooling shell cannot be obtained. In both cases, however, the distance must be adjusted so that the cooling shell 20D can cool the single-crystal under the condition that the dwelling time of the single-crystal in the temperature range of 850° to 1,050°C. is not longer than 140 min.

Furthermore, the tapering angle α of the tapered portion 70b of the cooling shell 20D should preferably be set to no less than 3°. The inventors have prepared a number of cooling shells with various tapering angles, and carried out experiments to ascertain the above optimal range of tapering angle. If the angle α is less than 3°, the single-crystal cannot be cooled evenly. The upper limit of the above angle α must be determined in consideration of the structure of the apparatus.

FIG. 16 depicts a modification of the above arrangement which includes a cylindrical cooling shell 20E having a radially inwardly extending protrusion 72 at its lower end. The protrusion 72 has an inclined inner peripheral surface 74 sloping radially inwardly and downwardly of the cooling shell 20E. This modification has the additional advantage that the manufacturing cost of the cooling shell 20E is low compared to the previous one 20D. Furthermore, the argon gas flowing down through the cooling shell 20E in a laminar flow is disrupted by the inclined surface 74 and becomes turbulent when blowing against the lower end of the single-crystal, thereby improving the cooling efficiency at the lower end of the crystal.

Figure 19:
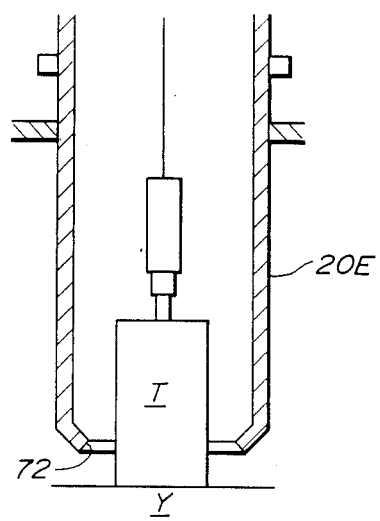

FIGS. 17 to 19 show various modifications of the above protrusion. In the modification of FIG. 17 wherein a tapered portion and a cylindrical portion is combined, the argon gas tends to flow laminarly, while the protrusion of a L-shaped cross-section shown in FIG. 18 tends to produce a turbulent flow. The modification in FIG. 19, wherein the protrusion is comprised of a tapered annular plate, produces a flow of argon gas exhibiting mildly chaotic flow. Furthermore, although in the above modifications, the lower end of the cooling shell 20E is formed as an acute angle, it may also be formed in a rounded way. If the lower end is so formed, the argon gas tends to flow laminarly. Accordingly, the cooling efficiency of the lower end of the single-crystal and the SiO removability can be precisely adjusted by suitably selecting the above configuration.

Figure 20:
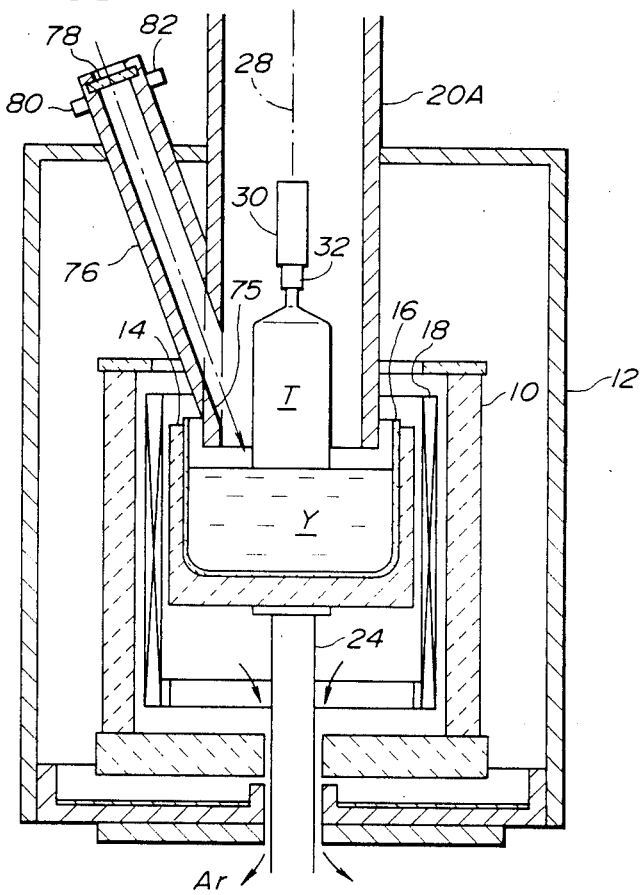
FIG. 20 is a cross-sectional view of a further modified crystal growing apparatus in accordance with the invention.

FIG. 20 shows a further modification of the crystal growing apparatus. In this arrangement, an opening 75 is formed through a side portion of the lower end portion of the cooling shell 20A, and an observing shell 76 is sealed at its lower opening end to the lower end portion of the cooling shell 20A in communication with the opening 75. The observing shell 76 is inclined and is sealed to and passes through the upper wall portion of the furnace 12, so that a light passage is defined therethrough. A window 78 made of a transparent plate such as heat-resistant glass is sealed and mounted at an upper opening end of the observing shell 76, so that the operator can observe the crystallization front of the single-crystal T through the window 78 during the pulling operation. The inner diameter of the observing shell 76 should be reduced as much as possible in order to reduce the cooling unevenness as long as sufficient observation is possible. Furthermore, the observing shell 76 is basically similar in structure to the cooling shell 20A in that it has a coolant passage defined therein, and a pair of inlet and outlet tubes 80 and 82 for coolant are attached to the upper end. Moreover, in the case where the cooling shell must be movable in a vertical direction, the observing shell 76 must be formed so that it can be detached from the cooling shell 20A.

Figure 21:
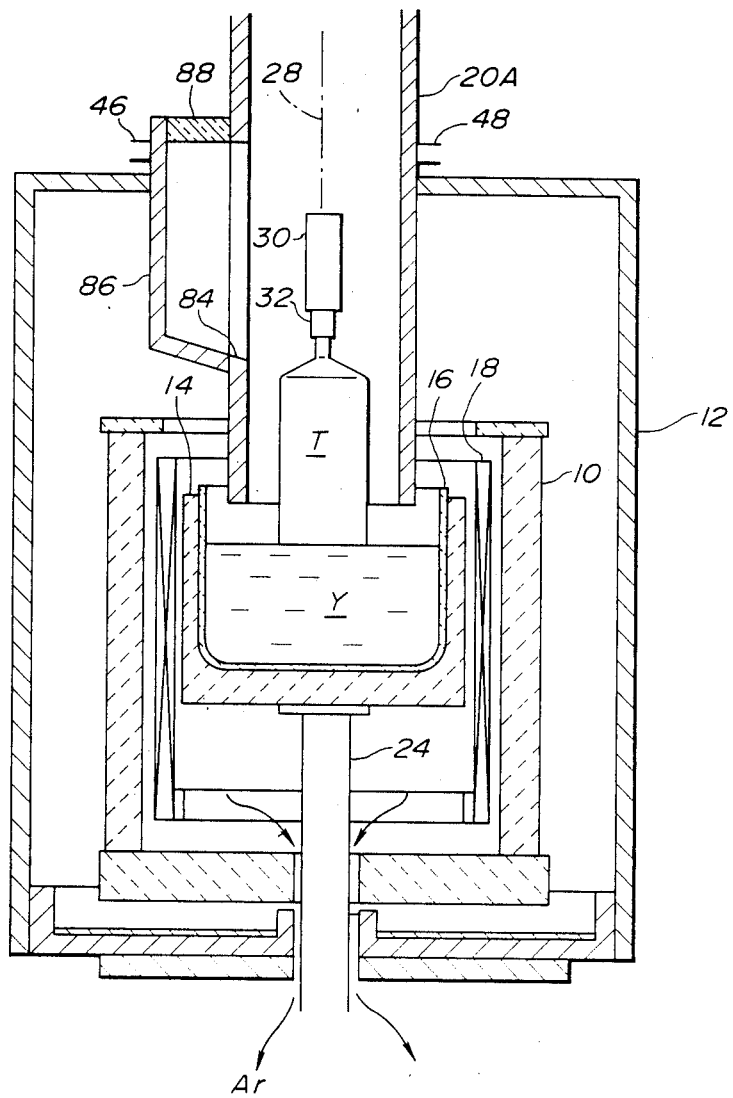
FIG. 21 is a cross-sectional view of a modification of the embodiment of FIG. 20.

FIG. 21 shows a modification of the apparatus of FIG. 20. In this modification, a vertically extending elongated opening 84 with a prescribed width is formed in a side portion of the cooling shell 20A in such a manner that it opens outside the furnace as well as inside the furnace, and a trough-like casing 86 is fixed to the side portion of the cooling shell 20A so as to surround the opening 84. The casing 86 has an upper opening, and a transparent window 88 is sealingly fitted in the opening. The casing 86 also has a coolant passage which is in fluid communication with the coolant passage in the cooling shell 20A. The coolant passages, however, may not be necessarily communicated to each other. With the above construction, the view through the window 88 can be widened compared with the previous arrangement. In addition, it is easy to support the casing and the cooling shell for vertical movement.

The present invention will hereinafter be illustrated by the following examples:

EXAMPLE 1

Silicon single-crystals, 155mm in diameter and 600mm in length, were manufactured using the apparatus shown in FIG. 6. Various annular reflecting metal plates and cooling water jackets were selectively employed as the temperature control shell, and various dwelling times were selected in three temperature ranges, i.e., 600° to 850° C.; 850° to 1,050° C.; and 1,050° to 1,400° C., in such a manner that the dwelling time in each temperature range was constant over the entire length of the silicon single-crystal.

Subsequently, wafers were cut from eight single-crystals thus produced, and were annealed by increasing their temperatures at 2° C/min to 1,100° C., holding them at temperature for one hour, and then cooling them. OSF densities were then measured.

The results are in the table below.

TABLE 1

| | | Dwelling time (min) | | | OSF densities $(cm^{-2})$ |
|---|---|---|---|---|---|
| | | Temperature range (°C.) | | | |
| | | 600–850 | 850–1,050 | 1,050–1,400 | |
| Examples | 1 | 220 | 140 | 230 | 70 |
| | 2 | 220 | 50 | 230 | <10 |
| | 1 | 220 | 210 | 230 | 500 |
| | 2 | 140 | 210 | 230 | 540 |
| Comparative | 3 | 50 | 210 | 230 | 530 |
| Examples | 4 | 220 | 210 | 230 | 510 |
| | 5 | 220 | 210 | 140 | 530 |
| | 6 | 220 | 210 | 100 | 520 |

As is clearly seen in the above table, OSF formation was very low in the silicon single-crystals of Examples 1 and 2. On the other hand, when the dwelling time in the 850° to 1,050° C. range was longer than 140 min, or when the temperature range did not fall within the 850° to 1,050° C. range, OSFs formed at high densities.

EXAMPLE 2

There were prepared a crystal growing apparatus as shown in FIG. 8 and an apparatus having a cooling shell as shown in FIG. 9. The apparatuses are identical in structure except that the cooling shells differ. The cooling shell shown in FIG. 9 had a number of projections of length 20 mm, and its inner surface area was double that of the cooling shell of FIG. 8. Silicon single-crystals were pulled by using these apparatuses under the same conditions.

As a result, the dwelling time of the single-crystal in the temperature of 850° to 1,050° C. was about 100 min when the apparatus of FIG. 8 was used. On the other hand, when the apparatus having the cooling shell of FIG. 9 was employed, the dwelling time was reduced to about 50 min.

EXAMPLE 3

The influence of the inner surface area of the cooling shell on the cooling efficiency was also examined.

There were prepared stainless steel cooling shells, 200 mm in inner diameter and 100 mm in height, having projections (20 mm in length) formed on an inner peripheral surface and having various inner surface areas. Furthermore, a cooling shell having no protrusions (inner surface area $S=3,140 cm^2$) was prepared as a comparative shell. Conditions such as the flow rate of the cooling water, the amount of silicon material placed in the crucible, the diameter of the single-crystal, the pulling rate, and the position of the cooling shell during pulling operation, were adjusted to be identical.

Figure 22:
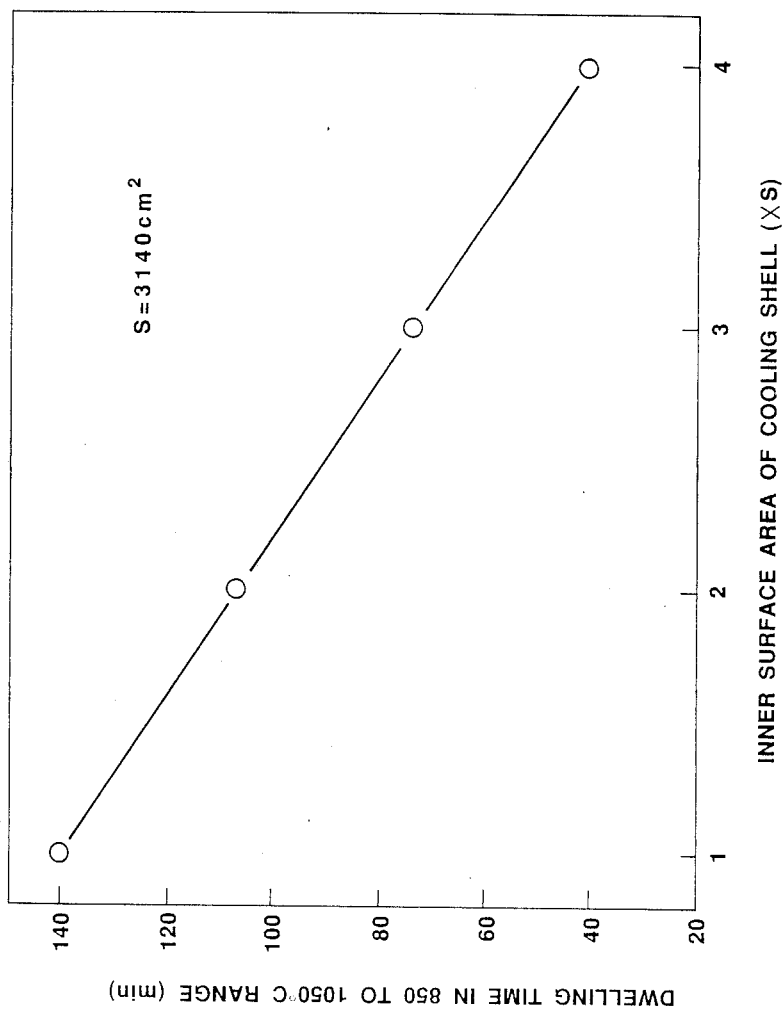
FIG. 22 is a graph showing the influence of the inner surface area of the cooling shell on a cooling efficiency.

The results are set forth in FIG. 22, in which the dwelling time of the single-crystal in the temperature range of 850° to 1,050° C. was measured and plotted against the inner surface area. As is seen in this graph, the inner surface area of the cooling shell is in inverse proportion to the dwelling time, so that the increase of the inner surface area of the cooling shell is effective in practising the method of the present invention.

EXAMPLE 4

There were prepared a crystal growing apparatus as shown in FIG. 13 and an apparatus as shown in FIG. 6. Silicon single-crystals were pulled by using these apparatuses, and specimens were cut from these crystals. Then, the specimens were subjected to heat treatments at 800° C. for 120 hours, and densities of oxygen precipitates were measured. The results are in the table below.

TABLE 2

| | Densities of oxygen precipitates $(cm^{-3})$ | | |
|---|---|---|---|
| | Upper portion | Middle portion | Lower portion |
| Apparatus of FIG. 13 | $4 \times 10^{10}$ | $3 \times 10^{10}$ | $3 \times 10^{10}$ |
| Apparatus of FIG. 6 | $3 \times 10^{9}$ | $2 \times 10^{9}$ | $1 \times 10^{9}$ |

As is clearly seen in the above table, when the single-crystals were produced by the apparatus with a secondary heater, oxygen precipitates formed at high densities.

What is claimed is:

1. In the method of growing silicon single-crystals by the Czochralski technique which comprises the steps of immersing a seed crystal in a silicon melt and pulling said seed crystal from said melt to thereby grow a silicon single-crystal, the improvement which comprises:
   (a) initially cooling the silicon single-crystal to 1,050° C.,
   (b) cooling the silicon single-crystal from 1,050° to 850° C. in no more than 140 minutes, and
   (c) cooling the silicon single-crystal from 800° to 600° C. in no less than 120 minutes.

* * * * *